United States Patent [19]
Park

[11] Patent Number: 6,021,164
[45] Date of Patent: Feb. 1, 2000

[54] DIGITAL RADIO COMMUNICATION SYSTEM HAVING REDUCED PHASE-LOCKED LOOP, AND ITS SYNCHRONIZATION

[75] Inventor: Jae-Sun Park, Ahnsan, Rep. of Korea

[73] Assignee: SamSung Electronics Co., Ltd., Suwon, Rep. of Korea

[21] Appl. No.: 08/777,765

[22] Filed: Dec. 30, 1996

[30] Foreign Application Priority Data

Dec. 26, 1995 [KR] Rep. of Korea ..................... 95-64221
Aug. 23, 1996 [KR] Rep. of Korea ..................... 96-35160

[51] Int. Cl.[7] ............................................. H04L 27/06
[52] U.S. Cl. ....................... 375/344; 375/327; 375/376; 455/75
[58] Field of Search .................... 375/316, 324, 375/326, 327, 346, 349, 350, 376, 375, 344; 370/321; 455/205, 208, 209, 76, 75, 84, 86, 87, 314, 315, 316

[56] References Cited

U.S. PATENT DOCUMENTS

| 5,398,002 | 3/1995 | Bang ........................................ 375/327 |
| 5,519,885 | 5/1996 | Vaisnen .................................... 455/76 |
| 5,528,633 | 6/1996 | Halik et al. ............................. 375/344 |
| 5,533,060 | 7/1996 | Kameo et al. .......................... 375/344 |
| 5,557,644 | 9/1996 | Kuwabara ............................... 375/327 |
| 5,564,099 | 10/1996 | Yonekura et al. ..................... 375/327 |
| 5,579,346 | 11/1996 | Kanzaki .................................. 375/327 |
| 5,802,447 | 9/1998 | Miyazaki ................................. 455/76 |

*Primary Examiner*—Chi H. Pham
*Assistant Examiner*—Bryan Webster
*Attorney, Agent, or Firm*—Robert E. Bushnell, Esq.

[57] ABSTRACT

A digital radio communication system includes a first down converter for converting down a predetermined radio frequency (RF) signal into a first intermediate frequency (IF) signal according to a first local oscillation signal; a second down converter for converting down the first IF signal into a second IF signal according to a second local oscillation signal; a demodulator for demodulating the second IF signal according to a third local oscillation signal and outputting a predetermined base band of a signal; a modulator for modulating the predetermined base band of signal according to the second local oscillation signal and outputting a third IF signal; a up converter for converting the third IF signal to a RF signal according to the first local oscillation signal; a first phase-locked loop (PLL) for controlling the first local oscillation signal in a direction where the sum of the frequency deviation between the first local oscillation signal and a reference frequency signal and the frequency deviation between the second local oscillation signal and the reference frequency signal is removed; and a second PLL for controlling the third local oscillation signal in a direction where the frequency deviation between the third local oscillation signal and the reference frequency signal is removed.

12 Claims, 5 Drawing Sheets

DIGITAL RADIO COMMUNICATION SYSTEM HAVING REDUCED PHASE-LOCKED LOOP, AND ITS SYNCHRONIZATION

CLAIM OF PRIORITY

This application makes reference to, incorporates the same herein, and claims all benefits accruing under 35 U.S.C §119 from an application entitled Digital Radio Communication System Having Reduced Phase-locked Loop, and its Synchronization earlier filed in the Korean Industrial Property Office on Dec. 29, 1995 and on Aug. 23, 1996, and there duly assigned Serial No.64221/1995 and 35160/1996, respectively, by that Office.

BACKGROUND OF THE INVENTION

1. Field of the Invention

The present invention relates to a digital radio communication system for time-division transmission/reception and, more particularly, to a digital radio communication system in which the number of phase-locked loops used for its synchronization is reduced, and a synchronization thereof.

2. Description of the Related Art

Generally speaking, a radio communication system is constructed with a transmitter for modulating information for transmission, and converting the modulated signal into a radio frequency (RF) signal which is then propagated into the air, and a receiver for receiving the RF signal from the air, and converting the radio frequency signal into an intermediate frequency (IF) signal which is then demodulated into the original information. More specifically, the radio communication system's transmitter includes a modulator for modulating the information for transmission, and a up converter for converting the signal modulated by the modulator into a signal suitable for propagation into the air. The receiver consists of a down converter for receiving the RF signal from the air and converting it into the IF signal suitable for processing, and a demodulator for demodulating the IF signal converted by the down converter and thus restoring the original information. Here, a local oscillator for converting up and another oscillator for converting down are connected, respectively, to the up converter and down converter, in order to offer predetermined oscillation frequencies for converting up and down.

The up converting and down converting local oscillators are separately provided and simultaneously connected to the up and down converters in case of an analog radio communication system which performs transmission and reception simultaneously. Meanwhile, for such a digital radio communication system as the global system for mobile communication (GSM), only one local oscillator is offered to be alternately coupled to the up and down converters. I have found that for this reason, a radio communication system for performing time-division transmission and reception needs to have a phase-locked loop able to control the local oscillator so that the local oscillator is in phase alternately with the up converter and the down converter within a predetermined time.

It should be, however, noted that phase-locked loops are often used for removing the frequency deviation of the signal oscillated by a local oscillator at a reference of the frequency produced from a reference frequency generator, are usually independently coupled to respective local oscillators for the purpose of the system's stability by reducing their frequency deviations. As a result, the signals processed at the respective stages of the system are synchronized and stably processed. The number of components required in the system is concomitantly increased however, and thus the cost of the circuit is accordingly raised because the phase locked loops are independently provided to the respective local oscillators. In addition, significantly more control signals are required in order to control the phase locked loops.

SUMMARY OF THE INVENTION

Therefore, in order to overcome such problems of prior art, it is an object of the present invention to provide a digital radio communication system having less PLLs.

It is another object of the present invention to provide a method of reducing components required in a digital radio communication system.

It is still another object of the present invention to provide a digital radio communication system for reducing the number of components controlled, and a method thereof.

To accomplish the objects of the present invention, the present invention provides a digital radio communication system for reducing the number of phase locked loops independently offered to local oscillators, by allowing them to remove the frequency deviation of local oscillators corresponding to themselves as well as those of other local oscillators. For the first aspect of the present invention, there is provided a digital radio communication system with a first down converter for converting down a predetermined radio frequency (RF) signal into a first intermediate frequency (IF) signal according to a first local oscillation signal; a second down converter for converting down the first IF signal into a second IF signal according to a second local oscillation signal; a demodulator for demodulating the second IF signal according to a third local oscillation signal and outputting a predetermined base band of a signal; a modulator for modulating the predetermined base band of signal according to the second local oscillation signal and outputting a third IF signal; a up converter for converting the third IF signal to a RF signal according to the first local oscillation signal; a first phase-locked loop (PLL) for controlling the first local oscillation signal in a direction where the sum of the frequency deviation between the first local oscillation signal and a reference frequency signal and the frequency deviation between the second local oscillation signal and the reference frequency signal is removed; and a second PLL for controlling the third local oscillation signal in a direction where the frequency deviation between the third local oscillation signal and the reference frequency signal is removed.

For the second aspect of the present invention, there is provided a digital radio communication system with a down converter for converting a predetermined radio frequency (RF) signal into an intermediate frequency (IF) signal according to a first local oscillation signal; a demodulator for demodulating the IF signal according to a second local oscillation signal and outputting a predetermined base band of a signal; a modulator for modulating the predetermined base band of signal according to the second local oscillation signal and outputting another IF signal; a up converter for converting the output of the modulator to a RF signal according to the first local oscillation signal; and a phase-locked loop (PLL) for controlling the first local oscillation signal in s a direction where the sum of the frequency deviation between the first local oscillation signal and a reference frequency signal and the frequency deviation between the second local oscillation signal and the reference frequency signal is removed.

For the third aspect of the present invention, there is provided a digital radio communication system using a first mixer for mixing a predetermined radio frequency (RF) signal with a first local oscillation signal to thereby output a first intermediate frequency (IF) signal; a second mixer for mixing the first IF signal with a second local oscillation signal to thereby output a second IF signal; a demodulator for demodulating the second IF signal according to a third local oscillation signal and outputting a predetermined base band of a signal; a modulator for modulating the predetermined base band of signal according to the second local oscillation signal and outputting a third IF signal; a third mixer for mixing the third IF signal with the first local oscillation signal to thereby output a RF signal; a first phase-locked loop (PLL) for controlling the first local oscillation signal in a direction where the frequency deviation of the signal output from the third mixer is removed; and a second PLL for controlling the third local oscillation signal in a direction where the frequency deviation between the third local oscillation signal and a reference frequency signal is removed.

For the fourth aspect of the present invention, there is provided a digital radio communication system using a first mixer for mixing a predetermined radio frequency (RF) signal with a first local oscillation signal to thereby output an intermediate frequency (IF) signal; a demodulator for demodulating the IF signal according to a second local oscillation signal and outputting a predetermined base band of a signal; a modulator for modulating the predetermined base band of signal according to the second local oscillation signal and outputting another IF signal; a second mixer for mixing the output of the modulator with the first local oscillation signal to thereby output a RF signal; and a phase-locked loop (PLL) for controlling the first local oscillation signal in a direction where the frequency deviation of the signal output from the second mixer is removed.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE PREFERRED EMBODIMENT

Figure 1:
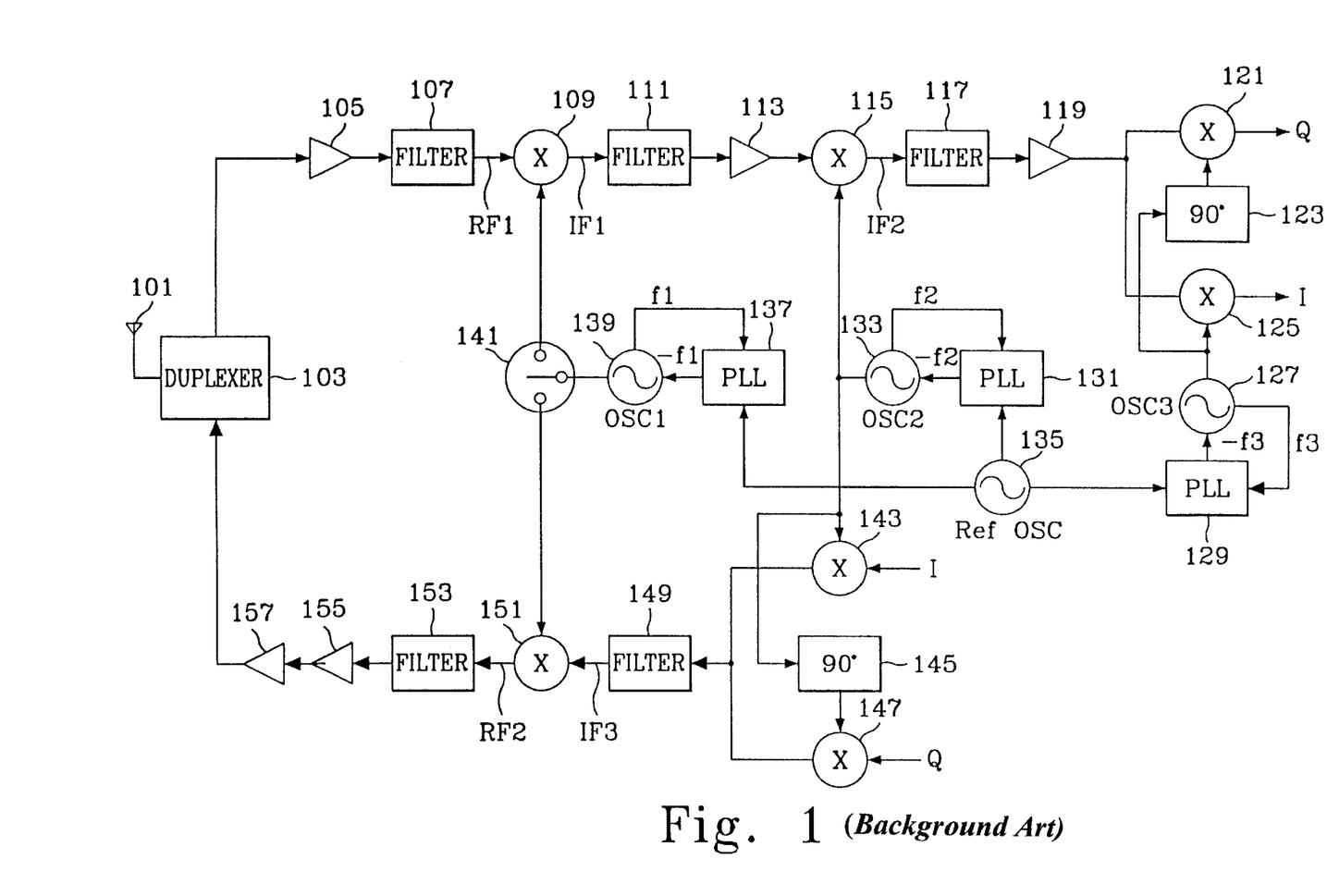
FIG. 1 is a block diagram showing the configuration of a hypothetical typical digital radio communication system.

FIG. 1 shows a diagram of the configuration of a general radio communication system for performing time-division transmission/reception including such a phase-locked loop, the system having two down converters and one up converter. In this figure reference numerals 109, 141, 139 and 137 are elements forming the primary down converter. Reference numerals 115, 133 and 131 are elements which form the secondary down converter. Reference numerals 151, 141, 139 and 137 are elements which form the up converter.

From now on, the radio communication system formed as in FIG. 1 is explained. The RF signal aerially received via an antenna 101 is applied to a low-noise amplifier 105 via a duplexer 103. This RF signal applied is amplified by a predetermined low noise by low-noise amplifier 105, filtered by filter 107, and then applied to a mixer 109 for primary down converting. Mixer 109 is oscillated by first local oscillator 139, and converts the filtered RF signal RF1 into first IF signal IF1. First IF signal IF1 is filtered and amplified by filter 111 and amplifier 113, and then applied to mixer 115 for secondary down converting. Mixer 115 is oscillated by second local oscillator 133, and converts down the signal received from amplifier 113. The converted signal is output as second IF signal IF2. Second IF signal IF2 is filtered and amplified by filter 117 and amplifier 119, and then applied to mixer 121 and mixer 125. Mixers 121 and 125 quadrature demodulates the signal output from amplifier 119 according to the signal applied after oscillated by third local oscillator 127, a demodulation oscillator, and outputs the demodulated signal separately as I-channel signal and Q-channel signal. Here, for quadrature demodulation, the third local oscillator and mixer 125 are directly coupled, and phase converter 123 for 90° shifting the signal oscillated by the third local oscillator between the third local oscillator and mixer 121. The I-channel and Q-channel signals are processed in a base band to be thereby restored to the original information.

From now on, the transmission of the digital radio communication system formed as in FIG. 1 will be explained. The I-channel and Q-channel signals are applied to mixers 143 and 147, and quadrature modulated according to the signal applied after being oscillated by the second local oscillator, a modulation oscillator. Here, for quadrature modulation, a phase converter 145 for 90° shifting the signal oscillated by the second local oscillator is coupled between the second local oscillator and mixer 147. The quadrature modulated signals output from mixers 143 and 147 are filtered by filter 149, and output as third IF signal IF3. Mixer 151 mixes the third IF signal IF3 according to the signal oscillated by first local oscillator 139, a up converting local oscillator, and applied via switch 141, to thereby output a second RF signal RF2. The second RF signal RF2 is filtered by filter 153, amplified by amplifiers 155 and 157, and applied to antenna 101 via duplexer 103 to be finally propagated into the air.

As shown in FIG. 1, the radio communication system performing time-division transmission/reception comprises primary and secondary down converters for converting a RF signal received into an IF signal according to the signal oscillated by a local oscillator, a up converter for converting the IF signal for transmission into a RF signal, a demodulator for converting the IF signal into a base band signal, and a modulator for converting the base band signal into an IF signal. Here, according to the digital radio communication system's characteristics, first local oscillator 139 is alternately coupled to the primary down converter and up converters, second local oscillator 133 to the secondary down converter and modulator. Besides local oscillators 139 and 133 alternately coupled, the digital radio communication system further comprises a third local oscillator for demodulator.

It should be, however, noted that phase-locked loops (PLL) for removing the frequency deviation of the signal oscillated by a local oscillator at a reference of the frequency produced from a reference frequency generator 135 are independently coupled to the respective local oscillators for the purpose of the system's stability. Specifically, PLL 137, PLL 131 and PLL 129 are independently coupled to first, second and third local oscillators 139, 133 and 127, in order to remove the frequency deviation. For instance, given that the frequency deviations of the signals oscillated by first, second and third local oscillators 139, 133 and 127 be f1, f2, f3, respectively, PLLs 137, 131 and 129 offer a signal having a frequency deviation of –f1, a signal having a frequency deviation of –f2, and a signal having a frequency deviation of –f3 to first, second and third local oscillators 139, 133 and 127 respectively corresponding thereto so as to reduce their frequency deviations. As a result, the signals processed at the respective stages of the system are synchronized and stably processed. However, the system's components are increased and thus its cost is raised because the PLLs are independently provided to the respective local oscillators. In addition, many control signals are required in order to control the PLLs.

Figure 2:
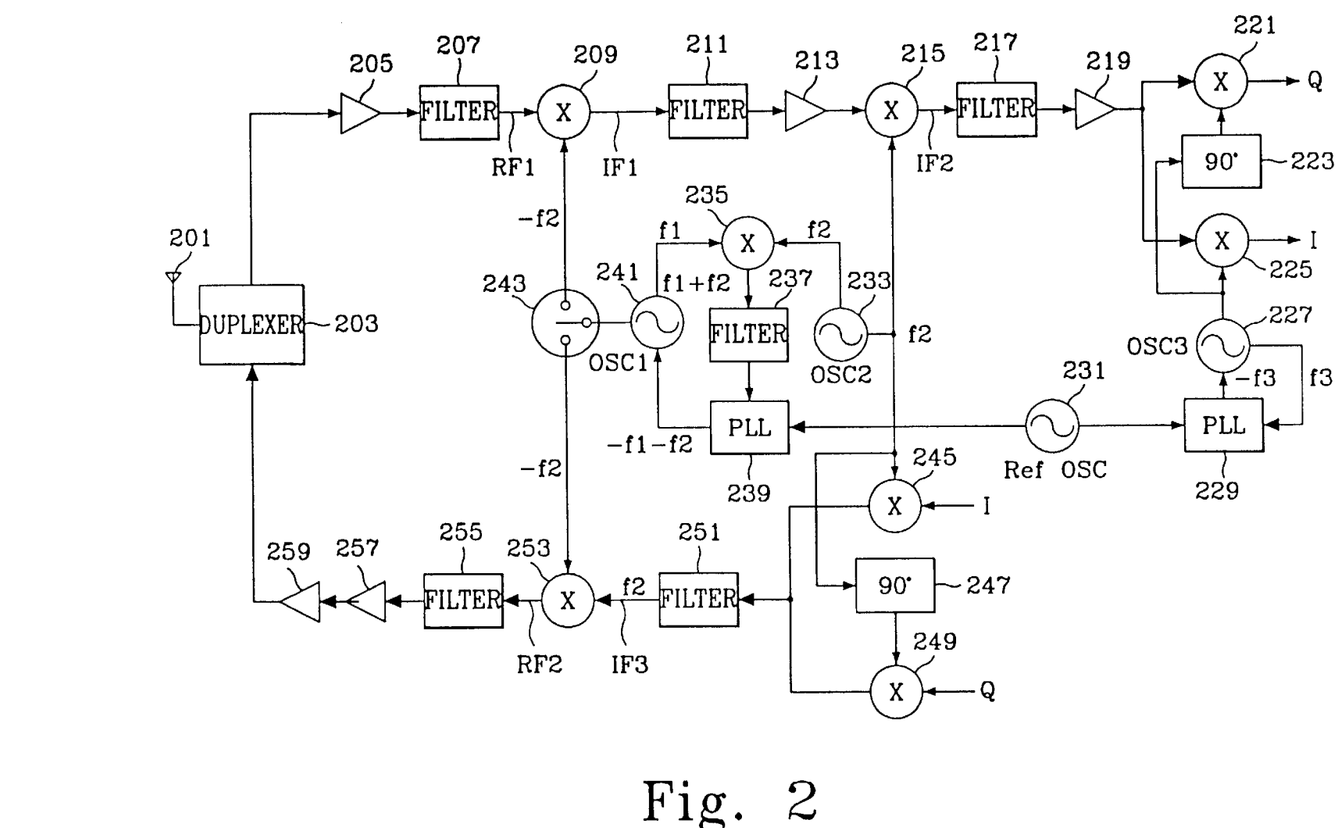
FIG. 2 is a diagram of the first embodiment of a digital radio communication system of the present invention.

Referring now to FIG. 2 showing the first embodiment of the present invention, it is noted that the digital radio communication system of the present invention has PLLs one less than those shown in FIG. 1. This first embodiment is applied to the radio communication system shown in FIG. 1 having primary and secondary down converter and up converter. The radio communication system of the prior art has three PLLs 137, 131 and 129 respectively corresponding to first local oscillator 139, second local oscillator 133 and third local oscillator 127 whereas the radio communication system of the present invention only two PLLs 229 and 239: one corresponding to third local oscillator 227; the other commonly corresponding to first and second local oscillators 241 and 233. While reducing one PLL, the present invention further comprises mixer 235 for mixing the outputs of first local oscillator 241 and second local oscillator 233, and a filter 237 for filtering the output of mixer 235 to thereby obtain the same effect—the frequency deviation of the secondarily down converted IF signal IF2 and the frequency deviation of up converted RF signal RF2 is 0–.

First of all, the synchronization of the radio communication system in down conversion is explained with reference to FIG. 2. The signal oscillated by first local oscillator 241 in down conversion is applied to mixer 209 for primary down conversion via switch 243. As described before, the primary down conversion of mixer 209 means to convert the first RF signal RF1 output from filter 207 into first IF signal IF1 according to the signal oscillated by first local oscillator 241. Here, the signal oscillated by first local oscillator 241 is also applied as one input of mixer 235. As the other input of mixer 235, the signal oscillated by second local oscillator 233 is applied, which is also supplied to mixer 215 for secondary down conversion. Mixer 235 mixes the signal oscillated by first local oscillator 241 and the signal oscillated by second local oscillator 233. The output of mixer 235 is filtered by filter 237 and applied to PLL 239. PLL 239 controls first local oscillator 241 using the output of filter 237.

More specific operation of the synchronization of the system will be explained below. Given that the frequency deviation of the signal oscillated by first local oscillator 241 be f1 and the frequency deviation of the signal oscillated by second local oscillator 233 be f2, mixer 235 mixes the two frequency deviations so that it applies a signal having a frequency deviation of f1+f2 to filter 237. Then, PLL 239 controls first local oscillator 241 in a direction where the frequency deviation f1+f2 applied from filter 237 is removed. In other words, PLL 239 outputs a signal having a frequency deviation of –f1–f2 to first local oscillator 241, and first local oscillator 241 applies a signal having a frequency deviation of –f2 to mixer 209 for primary down conversion. Mixer 209 outputs first IF signal IF1 having a frequency deviation –f2. First IF signal IF1 having the frequency deviation is applied to mixer 215 via filter 211 and amplifier 213 for the purpose of secondary down conversion. Here, as the other input of mixer 215, the signal having a frequency deviation of f2 oscillated by second local oscillator 233 is applied. Therefore, mixer 215 mixes the first IF signal having a frequency deviation of –f2 and the signal oscillated by the second local oscillator and having a frequency deviation of f2, to thereby output second IF signal IF2 having a frequency deviation of 0.

Now, the synchronization of the radio communication system of the present invention in case of up conversion will be described with reference to FIG. 2. The signal oscillated by first local oscillator 241 in up conversion is applied to mixer 253 for up conversion via switch 243. As described before, the up conversion of mixer 253 means to convert the third IF signal IF3 output from filter 251 into second RF signal RF2. Here, the signal oscillated by first local oscillator 241 is also applied as one input of mixer 235. As the other input of mixer 235, the signal oscillated by second local oscillator 233 is applied, which is also supplied to mixers 245 and 249 for modulation. Mixer 235 mixes the signal oscillated by first local oscillator 241 and the signal oscillated by second local oscillator 233. The output of mixer 235 is filtered by filter 237 and applied to PLL 239. PLL 239 controls first local oscillator 241 using the output of filter 237.

More specific operation of the synchronization of the system performed by PLL 239 will be explained below. Given that the frequency deviation of the signal oscillated by first local oscillator 241 be f1 and the frequency deviation of the signal oscillated by second local oscillator 233 be f2, mixer 235 mixes the two frequency deviations so that it applies a signal having a frequency deviation of f1+f2 to PLL 239. Then, filter 239 controls first local oscillator 241 in a direction where the frequency deviation f1+f2 applied from filter 237 is removed. In other words, PLL 239 outputs a signal having a frequency deviation of –f1–f2 to first local oscillator 241, and first local oscillator 241 applies a signal having a frequency deviation of –f2 to mixer 253 for up conversion. Here, as the other input of mixer 253, the signal having a frequency deviation of f2 oscillated by second local oscillator 233 is applied. Therefore, mixer 253 mixes the signal oscillated by first local oscillator 241 and having a frequency deviation of –f2 and the signal oscillated by the second local oscillator 233 and having a frequency deviation of f2, to thereby output a RF signal RF2 having a frequency deviation of 0.

In the first embodiment of the present invention compared with the prior art, mixer 235 and IS filter 237 are added but one PLL is reduced, obtaining the same effect. The prior art requires three PLLs: a PLL connected to the local oscillators for primary down conversion and up conversion; another PLL connected to the local oscillators for secondary down conversion and modulation; still another PLL connected to the local oscillator for modulation. However, this embodiment needs only two PLLs.

Figure 3:
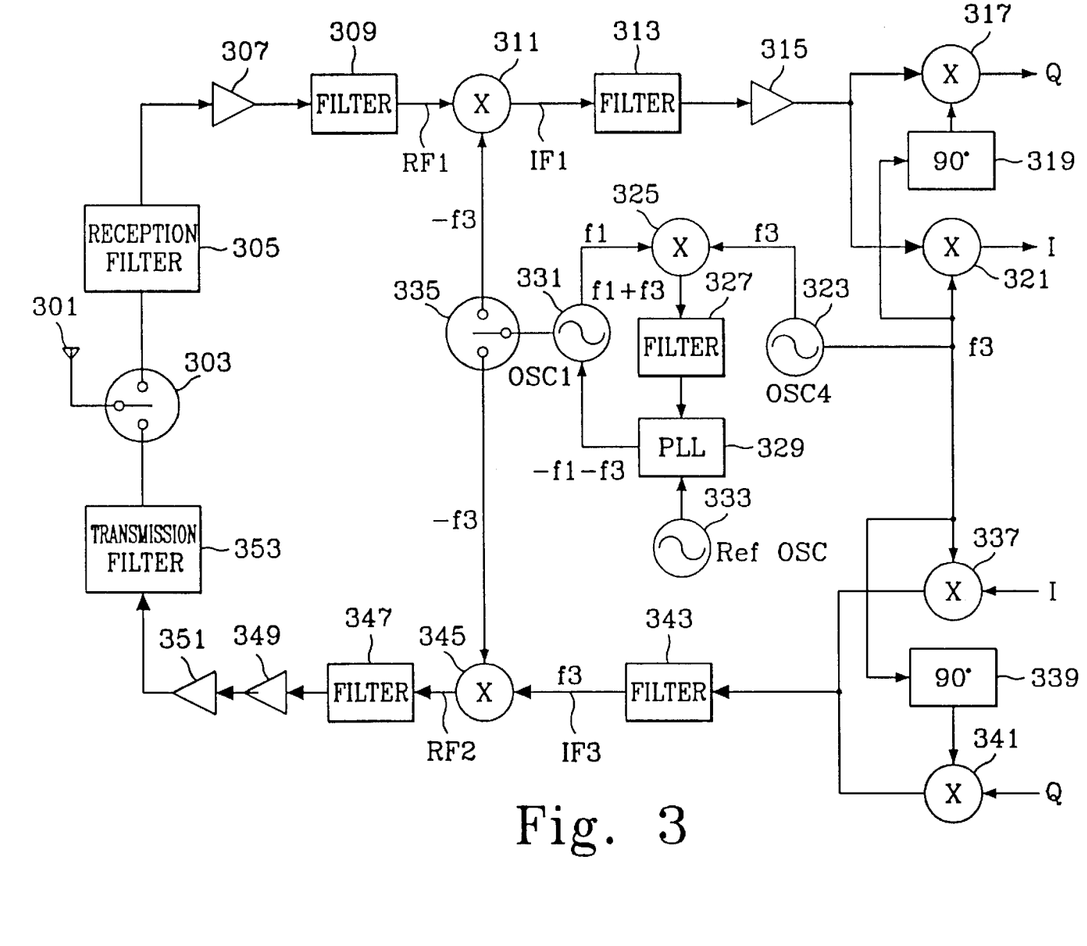
FIG. 3 is a diagram of the second embodiment of a digital radio communication system of the present invention.

Referring to FIG. 3 showing the second embodiment of the present invention, it is noted that the digital radio communication system of the present invention has only one PLL. This second embodiment is applied to a radio communication system having one down converter and one up converter, and as in the first embodiment comprises a mixer 325 for mixing the outputs of first local s oscillator 331 and fourth local oscillator 323, and a filter 327 for filtering the output of mixer 325 to thereby obtain the same effect—the frequency deviation of a demodulated I-channel signal and the frequency deviation of a Q-channel signal is 0–.

First of all, the synchronization of the radio communication system in reception (down conversion or demodulation) is explained with reference to FIG. 3. The signal oscillated by first local oscillator 331 in reception is applied to mixer 311 for down conversion via switch 335. Here, the signal oscillated by first local oscillator 331 is also applied as one input of mixer 325. As the other input of mixer 325, the signal oscillated by fourth local oscillator 323 is applied, which is also supplied to mixers 317 and 321 for demodulation. Mixer 325 mixes the signal oscillated by first local oscillator 331 and the signal oscillated by fourth local oscillator 323. The output of mixer 325 is filtered by filter 327 and applied to PLL 329. PLL 329 controls first local oscillator 331 using the output of filter 327.

More specific operation of the synchronization of the system performed by PLL 329 will be explained below. Given that the frequency deviation of the signal oscillated by first local oscillator 331 be f1 and the frequency deviation of the signal oscillated by fourth local oscillator 323 be f3, mixer 325 mixes the two frequency deviations so that it applies a signal having a frequency deviation of f1+f3 to filter 327. Then, filter 329 controls first local oscillator 331 in a direction where the frequency deviation f1+f3 applied from filter 327 is removed. In other words, PLL 329 outputs a signal having a frequency deviation of –f1–f3 to first local oscillator 331, and first local oscillator 331 applies a signal having a frequency deviation of –f3 to mixer 311 for down conversion. Then, mixer 311 outputs first IF signal IF1 having a frequency deviation of –f3. First IF signal IF1 having the frequency deviation is applied to mixers 317 and 321 via filter 313 and amplifier 315 for the purpose of demodulation. Here, as the other input of mixers 317 and 321, the signal having a frequency deviation of f3 oscillated by fourth local oscillator 323 is applied. Therefore, mixers 317 and 321 mix the IF signal IF1 having a frequency deviation of –f3 and the signal oscillated by the fourth local oscillator 323 and having a frequency deviation of f3, to thereby output I-channel and Q-channel signals of base band having a frequency deviation of 0.

Now, the synchronization of the radio communication system in up conversion is explained with reference to FIG. 3. The signal oscillated by first local oscillator 331 in up conversion is applied to mixer 345 for up conversion via switch 335. Here, the signal oscillated by first local oscillator 331 is also applied as one input of mixer 325. As the other input of mixer 325, the signal oscillated by fourth local oscillator 323 is applied, which is also supplied to mixers 337 and 341 for modulation. Mixer 325 mixes the signal oscillated by first local oscillator 331 and the signal oscillated by fourth local oscillator 323. The output of mixer 325 is filtered by filter 327 and applied to PLL 329. PLL 329 controls first local oscillator 331 using the output of filter 327.

More specific operation of the synchronization of the system performed by PLL 329 will be explained below. Given that the frequency deviation of the signal oscillated by first local oscillator 331 be f1 and the frequency deviation of the signal oscillated by fourth local oscillator 323 be f3, mixer 325 mixes the two frequency deviations so that it applies a signal having a frequency deviation of f1+f3 to filter 327. Then, filter 329 controls first local oscillator 331 in a direction where the frequency deviation f1+f3 applied from filter 327 is removed. In other words, PLL 329 outputs a signal having a frequency deviation of –f1–f3 to first local oscillator 331, and first local oscillator 331 applies a signal having a frequency deviation of –f3 to mixer 345 for up conversion. Here, as the other input of mixer 345, the signal having a frequency deviation of f3 oscillated by fourth local oscillator 323 is applied. Therefore, mixer 345 mixes the signal oscillated by first local oscillator 241 and having a frequency deviation of –f3 and the signal oscillated by the fourth local oscillator 323 and having a frequency deviation of f3, to thereby output a RF signal RF2 having a frequency deviation of 0.

In the second embodiment, one PLL, mixer 325 and filter 327 are added to obtain the same effect as in the prior art. In this embodiment only one PLL is required while the prior art needs two PLLs: one is connected to the down conversion and up conversion local oscillators; the other is connected to the modulation and demodulation local oscillators.

Figure 4:
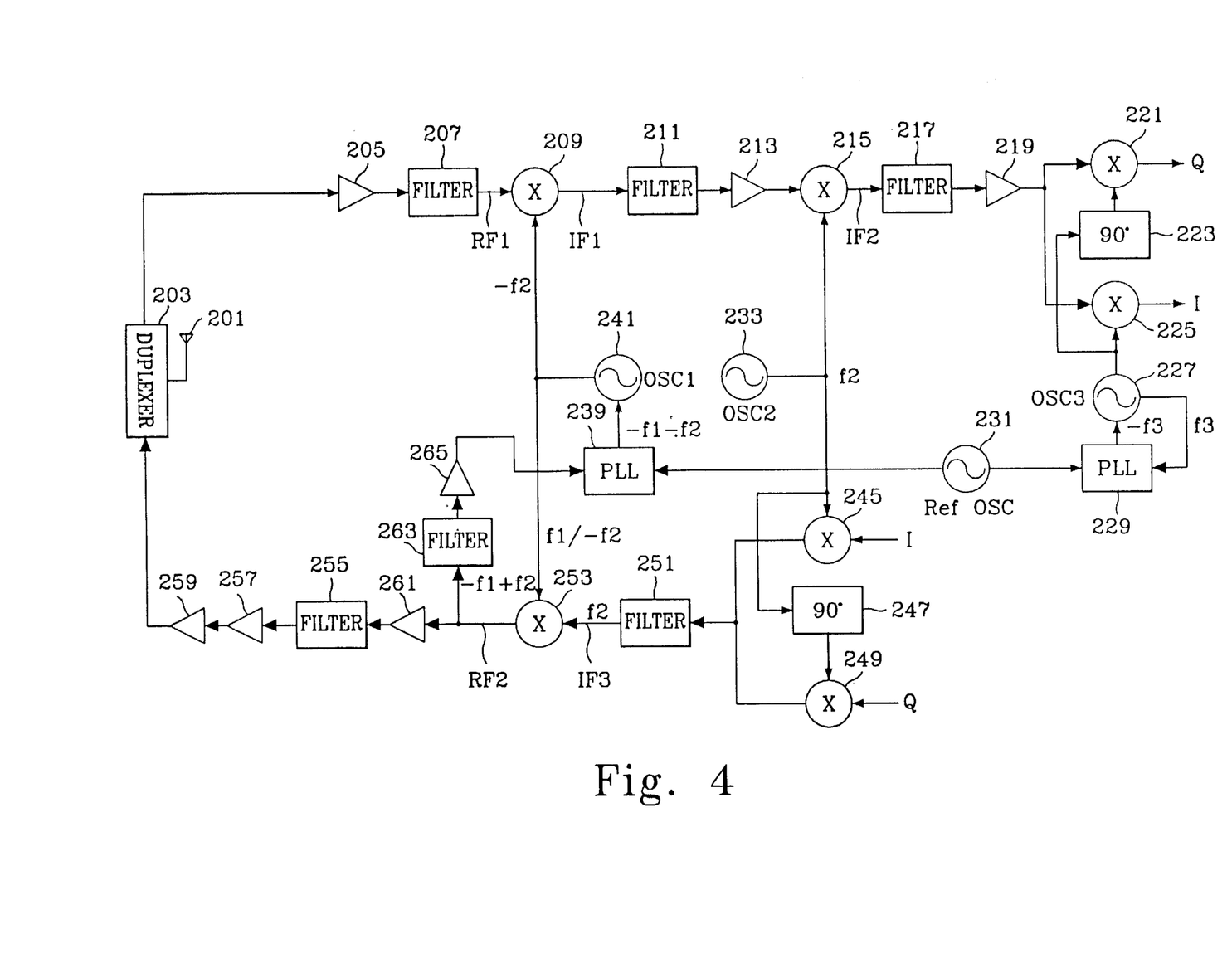
FIG. 4 is a diagram of the third embodiment of a digital radio communication system of the present invention.

FIG. 4 shows the third embodiment of the digital radio communication system of the present invention. This embodiment is a modification of the first embodiment shown in FIG. 2, eliminating mixer 235 of the first embodiment. In the third embodiment of the present invention, the frequency deviation of the signal oscillated by first local oscillator 241 and the frequency deviation of the signal oscillated by second local oscillator 233 are mixed by using mixer 253 provided in the prior art. Between mixer 253 and PLL 239 filter 263 and amplifier 265 are given to obtain the same effect as in the first embodiment of the present invention.

Referring to FIG. 4, the signal oscillated by first local oscillator 241 is applied to mixer 253, the signal oscillated by second local oscillator 233 being to mixers 245 and 249. If first local oscillator 241 oscillates a signal having a frequency deviation of f1 and second local oscillator 233 oscillates a signal having a frequency deviation of f2, mixer 253 receives and mixes the two signals to thereby output a signal having a frequency deviation of f1+f2. The output of mixer 253 having the frequency deviation of f1+f2 is applied to the PLL via filter 263 and amplifier 265. PLL 239 controls first local oscillator 241 in a direction where the frequency deviation of f1+f2 is removed. First local oscillator 241 oscillates a signal having a frequency deviation of –f2 according to PLL 239.

In this situation the down conversion and up conversion are performed as follows.

First, in down conversion, the signal oscillated by first local oscillator 241 and having a frequency deviation of –f2 is applied to mixer 209 for primary down conversion. Mixer 209 then converts first RF signal RF1 into first IF signal IF1 according to the local oscillation signal having a frequency deviation of –f2. The first IF signal IF1 is applied to mixer 215 which receives a signal having a frequency deviation of f2 and oscillated by second local oscillator 233 via filter 211 and amplifier 213. Mixer 215 converts first IF signal IF1 having a frequency deviation of –f2 into a second IF signal IF2 having a frequency deviation of 0 according to the local oscillation signal having a frequency deviation of f2.

In up conversion, the signal having a frequency deviation of –f2 and oscillated by first local oscillator 241 is applied to mixer 253 for up conversion. As the other input of mixer 253, the signal having a frequency deviation of f2 is applied in which a signal quadrature-modulated through mixers 245 and 249's mixing after being oscillated by second local oscillator 233 is filtered by filter 251. Mixer 253 mixes third IF signal IF3 having a frequency deviation of f2 according to the signal oscillated by first local oscillator 241 having a frequency deviation of −f2, to thereby output second RF signal RF2 having a frequency deviation of 0.

In this third embodiment of the present invention, mixer 235 is eliminated by using the fact that the function of mixer 235 shown in FIG. 2 is performed by mixer 253. In addition, between mixer 253 and PLL 239 filter 263 and amplifier 265 are connected to thereby obtain the same effect as in the first embodiment.

Figure 5:
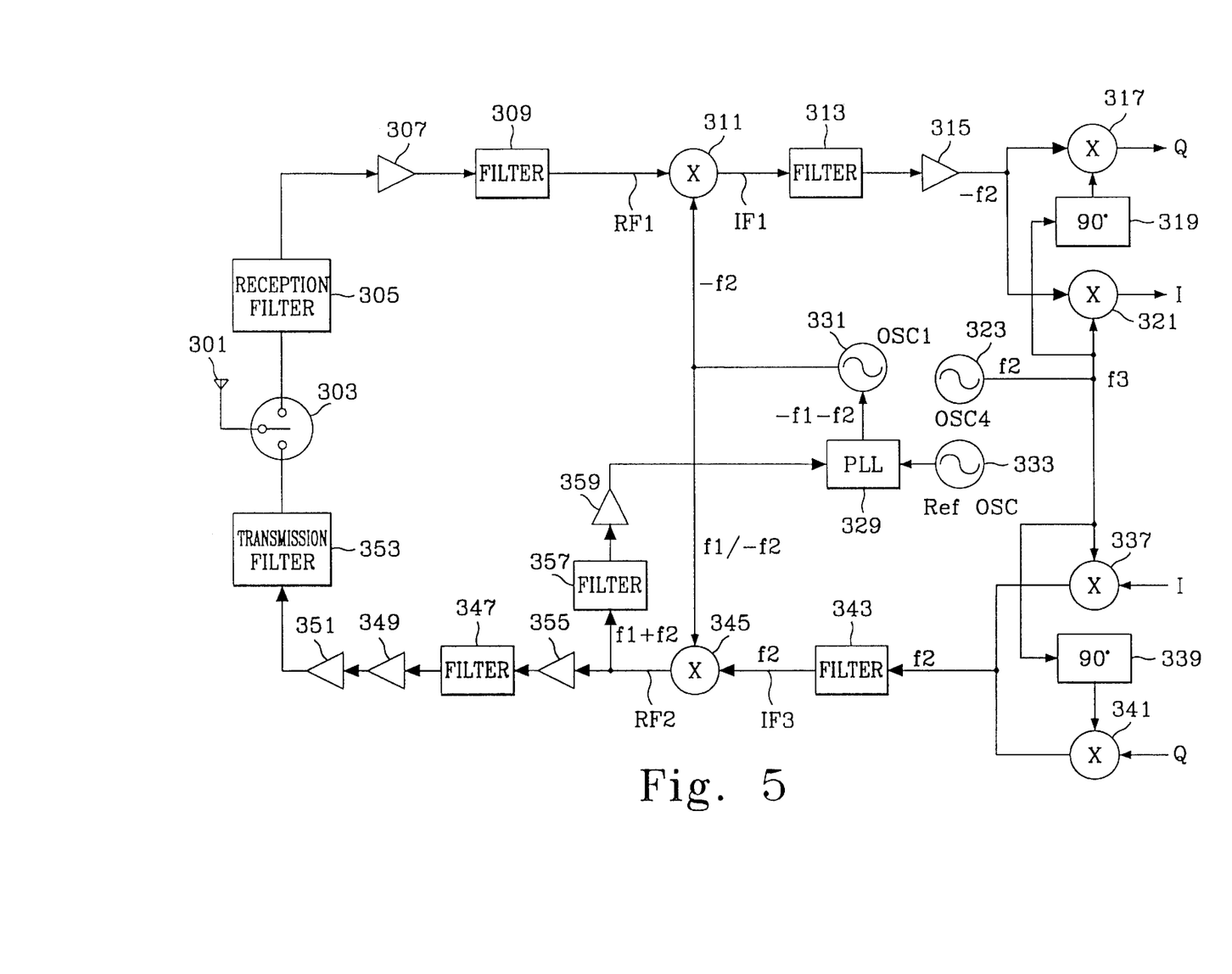
FIG. 5 is a diagram of the fourth embodiment of a digital radio communication system of the present invention.

FIG. 5 shows the fourth embodiment of the digital radio communication system of the present invention. This embodiment is a modification of the second embodiment shown in FIG. 3, eliminating mixer 325 of the second embodiment. In the fourth embodiment of the present invention the frequency deviation of the signal oscillated by first local oscillator 331 and the frequency deviation of the signal oscillated by fourth local oscillator 323 are mixed by using mixer 345 provided in the prior art. Between mixer 345 and PLL 329 filter 357 and amplifier 359 are given to obtain the same effect as in the second embodiment of the present invention.

Referring to FIG. 5, the signal oscillated by first local oscillator 331 is applied to mixer 345, the signal oscillated by fourth local oscillator 323 being to mixers 337 and 341. If first local oscillator 331 oscillates a signal having a frequency deviation of f1 and fourth local oscillator 323 oscillates a signal having a frequency deviation of f2, mixer 345 receives and mixes the two signals to thereby output a signal having a frequency deviation of f1 +f2. The output of mixer 345 having the frequency deviation of f1+f2 is applied to the PLL 329 via filter 357 and amplifier 359. PLL 329 controls first local oscillator 331 in a direction where the frequency deviation of f1+f2 is removed. First local oscillator 331 oscillates a signal having a frequency deviation of −f2 according to PLL 329.

In this situation the down conversion and up conversion are performed as follows.

First, in down conversion, the signal oscillated by first local oscillator 331 and having a frequency deviation of −f2 is applied to mixer 311 for down conversion. Mixer 311 then converts first RF signal RF1 into IF signal IF1 according to the local oscillation signal having a frequency deviation of −f2. The first IF signal IF1 is applied to mixers 317 and 321 which receive a signal having a frequency deviation of f2 and oscillated by fourth local oscillator 323 via filter 313 and amplifier 315. Mixers 317 and 321 convert IF signal IF1 having a frequency deviation of −f2 into Q-channel and I-channel signals of a base band having a frequency deviation of 0 according to the local oscillation signal having a frequency deviation of f2.

In up conversion, the signal having a frequency deviation of −f2 and oscillated by first local oscillator 331 is applied to mixer 345 for up conversion. As the other input of mixer 345, the signal having a frequency deviation of f2 is applied in which a signal quadrature-modulated through mixers 337 and 341's mixing after being oscillated by fourth local oscillator 323 is filtered by filter 343. Mixer 345 mixes IF signal IF2 having a frequency deviation of f2 and output from filter 343 according to the signal oscillated by first local oscillator 331 having a frequency deviation of −f2, to thereby output RF signal RF2 having a frequency deviation of 0.

In this fourth embodiment of the present invention, mixer 325 is eliminated by using the fact that the function of mixer 325 shown in FIG. 3 is performed by mixer 345. In addition, between mixer 345 and PLL 329 filter 357 and amplifier 359 are connected to thereby obtain the same effect as in the second embodiment.

As described above, the present invention provides a digital radio communication system in which PLLs independently required for down/up conversion and modulation/demodulation process the frequency deviations of local oscillators corresponding to themselves as well as those of other local oscillators. Accordingly, the number of PLLs inevitably necessary in the digital radio communication system can be reduced. This in turn reduces the number of components to control in the system.

Therefore, it should be understood that the present invention is not limited to the particular embodiment disclosed herein as the best mode contemplated for carrying out the present invention, but rather that the present invention is not limited to the specific embodiments described in this specification except as defined in the appended claims.

What is claimed is:

1. A digital radio communication system comprising:
    a first down converter for converting down a predetermined radio frequency (RF) signal into a first intermediate frequency (IF) signal according to a first local oscillation signal;
    a second down converter for converting down the first IF signal into a second IF signal according to a second local oscillation signal;
    a demodulator for demodulating the second IF signal according to a third local oscillation signal and outputting a received base band signal;
    a modulator for modulating a transmission base band signal according to the second local oscillation signal and outputting a third IF signal:
    an up converter for converting the third IF signal to a RF signal according to the first local oscillation signal;
    a first phase-locked loop (PLL) for controlling the first local oscillation signal in a direction where the sum of the frequency deviation between the first local oscillation signal and a reference frequency signal and the frequency deviation between the second local oscillation signal and the reference frequency signal is removed; and
    a second PLL for controlling the third local oscillation signal in a direction where the frequency deviation between the third local oscillation signal and the reference frequency signal is removed.

2. The system as claimed in claim 1, further comprising a mixer for mixing the frequency deviation between the first local oscillation signal and the reference frequency signal and the frequency deviation between the second local oscillation signal and the reference frequency signal.

3. A digital radio communication system comprising:
    a down converter for converting a predetermined radio frequency (RF) signal into an intermediate frequency (IF) signal according to a first local oscillation signal;
    a demodulator for demodulating the IF signal according to a second local oscillation signal and outputting a received base band signal;
    a modulator for modulating transmission base band signal according to the second local oscillation signal and outputting another IF signal;
    an up converter for converting the output of the modulator to a RF signal according to the first local oscillation signal; and
    a phase-locked loop (PLL) for controlling the first local oscillation signal in a direction where the sum of the frequency deviation between the first local oscillation signal and a reference frequency signal and the frequency deviation between the second local oscillation signal and the reference frequency signal is removed.

4. The system as claimed in claim 3, further comprising a mixer for mixing the frequency deviation between the first local oscillation signal and the reference frequency signal and the frequency deviation between the second local oscillation signal and the reference frequency signal.

5. A digital radio communication system comprising:

a first mixer for mixing a predetermined radio frequency (RF) signal with a first local oscillation signal to thereby output a first intermediate frequency (IF) signal;

a second mixer for mixing the first IF signal with a second local oscillation signal to thereby output a second IF signal;

a demodulator for demodulating the second IF signal according to a third local oscillation signal and outputting a received base band signal;

a modulator for modulating a transmission base band signal according to the second local oscillation signal and outputting a third IF signal;

a third mixer for mixing the third IF signal with the first local oscillation signal to thereby output a RF signal;

a first phase-locked loop (PLL) for controlling the first local oscillation signal in a direction where the frequency deviation of the signal output from the third mixer is removed; and a second PLL for controlling the third local oscillation signal in a direction where the frequency deviation between the third local oscillation signal and a reference frequency signal is removed.

6. A digital radio communication system comprising:

a first mixer for mixing a predetermined radio frequency (RF) signal with a first local oscillation signal to thereby output an intermediate frequency (IF) signal;

a demodulator for demodulating the IF signal according to a second local oscillation signal and outputting a received base band signal;

a modulator for modulating a transmission base band signal according to the second local oscillation signal and outputting another IF signal;

a second mixer for mixing the output of the modulator with the first local oscillation signal to thereby output a RF signal; and a phase-locked loop (PLL) for controlling the first local oscillation signal in a direction where the frequency deviation of the signal output from the second mixer is removed.

7. A digital radio communication system comprising:

a first down converter for converting down a predetermined radio frequency (RF) signal into a first intermediate frequency (IF) signal according to a first local oscillation signal;

a second down converter for converting down the first IF signal into a second IF signal according to a second local oscillation signal;

a demodulator for demodulating the second IF signal according to a third local oscillation signal and outputting a received base band signal;

a modulator for modulating a transmission base band signal according to the second local oscillation signal and outputting a third IF signal;

an up converter for converting the third IF signal to a RF signal according to the first local oscillation signal;

a first local oscillator for generating said first local oscillation signal;

a second local oscillator for generating said second local oscillation signal;

a mixer for mixing said first and second local oscillation signals to output a mixed signal having a summed frequency deviation according to a sum of a first frequency deviation of said first local oscillation signal applied to said mixer and a second frequency deviation of said second local oscillation signal applied to said mixer;

a switch for outputting said first local oscillation signal generated by said first local oscillator to one of said first down converter and said up converter, characterized in that said first local oscillation signal output by said switch has a frequency deviation opposite said second frequency deviation;

a first phase-locked loop (PLL) responsive to a reference frequency signal generated by a reference oscillator for removing said summed frequency deviation output from said mixer; and a second PLL responsive to said reference frequency signal for removing a third frequency deviation from said third local oscillation signal.

8. The digital radio communication system as set forth in claim 7, wherein said up converter comprises a mixer and said third IF signal has said second frequency deviation, said second frequency deviation being removed from said third IF signal in response to the frequency deviation of said first local oscillation signal output from said switch.

9. A digital radio communication system comprising:

a down converter for converting down a predetermined radio frequency (RF) signal into a first intermediate frequency (IF) signal according to a first local oscillation signal a demodulator for demodulating the first IF signal according to a second local oscillation signal and outputting a received base band signal;

a modulator for modulating a transmission base band signal according to the second local oscillation signal and outputting a second IF signal;

an up converter for converting the second IF signal to a RF signal according to the first local oscillation signal;

a first local oscillator for generating said first local oscillation signal;

a second local oscillator for generating said second local oscillation signal;

a mixer for mixing said first and second local oscillation signals to output a mixed signal having a summed frequency deviation according to a sum of a first frequency deviation of said first local oscillation signal applied to said mixer and a second frequency deviation of said second local oscillation signal applied to said mixer;

a switch for outputting said first local oscillation signal generated by said first local oscillator to one of said first down converter and said up converter, characterized in that said first local oscillation signal output by said switch has a frequency deviation opposite said second frequency deviation; and a first phase-locked loop (PLL) responsive to a reference frequency signal generated by a reference oscillator for removing said summed frequency deviation output from said mixer.

10. The digital radio communication system as set forth in claim 9, wherein said up converter comprises a mixer and said second IF signal has said second frequency deviation, said second frequency deviation being removed from said second IF signal in response to the frequency deviation of said first local oscillation signal output from said switch.

11. A digital radio communication system comprising:
- a first mixer for converting down a predetermined radio frequency (RF) signal into a first intermediate frequency (IF) signal according to a first local oscillation signal;
- a second mixer for converting down the first IF signal into a second IF signal according to a second local oscillation signal;
- a demodulator for demodulating the second IF signal according to a third local oscillation signal and outputting a received base band signal;
- a modulator for modulating a transmission base band signal according to the second local oscillation signal and outputting a third IF signal;
- an up converter for converting the third IF signal to a RF signal according to the first local oscillation signal;
- a first local oscillator for generating said first local oscillation signal;
- a second local oscillator for generating said second local oscillation signal;
- a third mixer for mixing said first and second local oscillation signals to output a mixed signal having a summed frequency deviation according to a sum of a first frequency deviation of said first local oscillation signal applied to said mixer and a second frequency deviation of said second local oscillation signal applied to said mixer;
- a switch for outputting said first local oscillation signal generated by said first local oscillator to one of said first mixer and said up converter, characterized in that said first local oscillation signal output by said switch has a frequency deviation opposite said second frequency deviation;
- a first phase-locked loop (PLL) responsive to a reference frequency signal generated by a reference oscillator for removing said summed frequency deviation output from said mixer; and
- a second PLL responsive to said reference frequency signal for removing a third frequency deviation from said third local oscillation signal.

12. The digital radio communication system as set forth in claim 11, wherein said up converter comprises a fourth mixer and said third IF signal has said second frequency deviation, said second frequency deviation being removed from said third IF signal in response to the frequency deviation of said first local oscillation signal output from said switch.

* * * * *